United States Patent
Kozaki et al.

(10) Patent No.: US 6,627,520 B2
(45) Date of Patent: Sep. 30, 2003

(54) NITRIDE SEMICONDUCTOR SUBSTRATE AND METHOD FOR MANUFACTURING THE SAME, AND NITRIDE SEMICONDUCTOR DEVICE USING NITRIDE SEMICONDUCTOR SUBSTRATE

(75) Inventors: Tokuya Kozaki, Anan (JP); Hiroyuki Kiyoku, Anan (JP); Kazuyuki Chocho, Anan (JP); Hitoshi Maegawa, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/260,442

(22) Filed: Oct. 1, 2002

(65) Prior Publication Data

US 2003/0032288 A1 Feb. 13, 2003

Related U.S. Application Data

(62) Division of application No. 09/880,843, filed on Jun. 15, 2001.

(30) Foreign Application Priority Data

Dec. 28, 2000 (JP) ........................................ 2000-402378
Jun. 19, 2000 (JP) ........................................ 2000-183707

(51) Int. Cl.[7] .............................................. H01L 21/20
(52) U.S. Cl. ........................... 438/479; 438/22; 438/24; 438/483; 438/41
(58) Field of Search ............................ 438/22, 41, 44, 438/46, 479, 483, 722, 724, 756, 757

(56) References Cited

U.S. PATENT DOCUMENTS 5,676,752 A 10/1997 Bozler et al.
6,030,849 A * 2/2000 Hasegawa .................... 438/46
6,091,085 A * 7/2000 Lester .......................... 257/98
6,121,121 A * 9/2000 Koide ......................... 438/481
6,177,359 B1 * 1/2001 Chen et al. ................... 438/51

(List continued on next page.)

FOREIGN PATENT DOCUMENTS

JP 11-329971 A 11/1999
JP 11-329971 * 11/1999

(List continued on next page.)

OTHER PUBLICATIONS

International Search Report mailed Jul. 18, 2002.

(List continued on next page.)

*Primary Examiner*—Savitri Mulpuri
(74) *Attorney, Agent, or Firm*—Nixon & Vanderhye P.C.

(57) ABSTRACT

A nitride semiconductor substrate including (a) a supporting substrate, (b) a first nitride semiconductor layer having a periodical T-shaped cross-section, having grown from periodically arranged stripe-like, grid-like or island-like portions on the supporting substrate, and (c) a second nitride semiconductor substrate covering said supporting substrate, having grown from the top and side surfaces of said first nitride semiconductor layer, wherein a cavity is formed under the second nitride semiconductor layer.

A protective layer having a periodically arranged stripe-like, grid-like or island-like apertures is formed on the supporting substrate. The first nitride semiconductor layer is laterally grown from the exposed portion of the substrate. The growth is stopped before the first nitride semiconductor layer covers the supporting substrate. Thus, the first nitride semiconductor layer has a periodical T-shaped cross-section. Then, the protective layer is removed and the second nitride semiconductor layer is grown from the top and side surface of the first nitride semiconductor layer to cover the substrate.

8 Claims, 10 Drawing Sheets

U.S. PATENT DOCUMENTS

| | | | | |
|---|---|---|---|---|
| 6,240,115 | B1 | * | 5/2001 | Chen et al. .................... 372/45 |
| 6,252,261 | B1 | * | 6/2001 | Usui et al. ................... 257/190 |
| 6,261,929 | B1 | * | 7/2001 | Gehrke et al. .............. 438/478 |
| 6,335,546 | B1 | * | 1/2002 | Tsuda et al. ................... 257/94 |
| 6,348,096 | B1 | * | 2/2002 | Sunakawa et al. ............ 117/88 |
| 6,420,198 | B1 | * | 7/2002 | Kimura et al. ................ 438/22 |
| 2002/0090816 | A1 | * | 7/2002 | Ashby et al. ............... 438/686 |
| 2002/0115267 | A1 | * | 8/2002 | Tomiya et al. .............. 438/478 |
| 2002/0117104 | A1 | * | 8/2002 | Hata et al. .................... 117/97 |

FOREIGN PATENT DOCUMENTS

| | | |
|---|---|---|
| WO | 99/65068 A1 | 12/1999 |
| WO | 00/04615 A1 | 1/2000 |

OTHER PUBLICATIONS

Zheleva et al. "Pendeo–epitaxy—A New Approach for Lateral Growth of Gallium Nitride Structures", MRS Internet Journal Of Nitride Semiconductor Research, Material Research Society, Warrendale, PA, US, vol. 4S1, Nov. 30, 1998, XP002117241.

Nakamura, "INGAN Multiquantum–Well–Structure Laser Diodes with GAN–ALGAN Modulation–Doped Strained–Layer Superlatticies", IEEE Journal of Selected Topics in Quantum Electronics, IEEE Service Center, U.S., vol. 4, No. 3, May 1, 1998, pp. 483–489, XP000782257.

Nakamura et al, "High–Power, Long–Lifetime InGaN/GaN/AlGaN–Based Layer Diodes Grown on Pure GaN Substrates", Jpn. J. Appl. Phys., vol. 37, 1998, pp. L309–L312.

Nakamura et al, "InGaNGaN/GaN–based Laser Diodes with Cleaved Facets Grown on GaN Substates", Applied Physics Letters, vol. 73, No. 6, 1998, pp. 832–834.

Nakamura, "InGaN Multiquantum–Well–Structure Laser Diodes with GaN–AlGaN Modulation–Doped Strained–Layer Superlattices", IEEE Journal of Selected Topics in Quantum Electronics, vol. 4, No. 3, 1998, pp. 483–489.

Mukai et al., "Ultraviolet InGaN and GaN Single–Quantum–Well–Structure Light–Emitting Diodes Grown on Epitaxially Latterally Overgrown GaN Substrates", Jpn. Appl. Phys., vol. 38, 1999, pp. 5735–5739.

Nakamura, "Blue Light Emitting Laser Diodes", Thin Solid Films, 343–344, 1999, pp. 345–349.

Mukai et al, "InGaN–Based Blue Light–Emitting diodes Grown on Epitaxially Latterally Overgrown GaN Substrates"Jpn. J. Appl. Phys., vol. 37, 1998, pp. L839–L841.

Nakamura et al, "InGaN/GaN/GaN–Based Laser Diodes with Modulation–Doped Strained–Layer Superlattices grown on an Epitaxially Laterally Overgrown GaN Substrate", Appl. Phys. Lett. 72(2), 1998, pp. 211–213.

Office Action dated Dec. 19, 2002 in corresponding parent application serial no. 09/880,843.

* cited by examiner

ORIENTATION-FLAT SURFACE

NITRIDE SEMICONDUCTOR SUBSTRATE AND METHOD FOR MANUFACTURING THE SAME, AND NITRIDE SEMICONDUCTOR DEVICE USING NITRIDE SEMICONDUCTOR SUBSTRATE

This application is a division of application Ser. No. 09/880,843, filed Jun. 15, 2002, the entire content of which is hereby incorporated by reference in this application.

TECHNICAL FIELD

The present invention relates to a method for growing a nitride semiconductor ($In_xAl_yGa_{1-x-y}N$, $0 \leq X$, $0 \leq Y$, $X+Y \leq 1$), and particularly to a method for growing a nitride semiconductor which can be used to make a nitride semiconductor substrate.

BACKGROUND ART

Recently various researches have been conducted on the growth of nitride semiconductor on a substrate made of a different material such as sapphire, spinel or silicon carbide which has a lattice constant different from that of the nitride semiconductor.

For example, a method of growing epitaxial lateral overgrowth GaN (ELOG) is described in JPN. J. Appl. Phys., vol. 37 (1998), pp. L309–L312, wherein nitride semiconductor having lower density of dislocations is obtained by forming a protective film of $SiO_2$ or other material partially on a nitride semiconductor which has been grown on the C plane of sapphire, and growing nitride semiconductor thereon under a reduced pressure of 100 Torr.

In the ELOG growing process, nitride semiconductor having reduced dislocation defects can be formed on the protective film by intentionally growing the nitride semiconductor laterally on the protective film. When the nitride semiconductor grows, dislocation occurs and grows only in a window portion of the protective film.

However, in case the protective film of $SiO_2$ or the like has wide stripe width, lateral growth of the nitride semiconductor on the protective film does not fully proceed eventually resulting in abnormal growth.

In addition, in case the nitride semiconductor is grown laterally by vapor phase deposition process, while two nitride semiconductor films which grow laterally from the nitride semiconductor exposed on both sides of the protective film meet and join with each other at the center of the protective film, dislocations concentrate locally at the joint. This is partly due to the fact that the front surface of the nitride semiconductor is tilted while growing laterally on the protective film of $SiO_2$ or the like. In case a device layer is formed by epitaxial growth on a nitride semiconductor substrate such as the above, microscopic pits are likely to be generated in the joint where the dislocations are concentrated. The pits are generated by the dissociation of nitrogen in the process of heating the substrate for the purpose of growing the device layer. The pits grow larger as the epitaxial growth is continued.

As a result, even when a single continuous nitride semiconductor substrate is formed by growing nitride semiconductor layer laterally on a protective film by the vapor phase deposition process, it cannot be handled in the same way as an ordinary single crystal substrate. Since the active layer of a semiconductor laser should keep clear of the vicinity of the joint, it is difficult to secure a region large enough for forming the device. Moreover, since surface of the single nitride semiconductor substrate appears to be uniform, it has been difficult to recognize the joint by viewing the top surface of the substrate and to carry out the formation of device pattern accurately.

Furthermore, in case a single continuous nitride semiconductor substrate is formed by growing nitride semiconductor laterally by using a protective film on sapphire or the like, such a structure is likely to warp. Because sapphire, the protective film and the nitride semiconductor layer, which are stacked one on another, have different coefficients of thermal expansion.

The different-material substrate may also be removed from the nitride semiconductor substrate in the last stage. The substrate of different material maybe removed by polishing or irradiating the interface between the substrate and the nitride semiconductor with excimer laser thereby breaking the chemical bond in the interface. However, it has not been easy to remove a different-material substrate such as sapphire as it takes a long time to remove by polishing or by means of excimer laser.

An object of the present invention is to provide a new structure of nitride semiconductor substrate manufactured by lateral crystal growth with a protective film, which is capable of suppressing an adverse effect caused on the device by joining the nitride semiconductor layers on the protective film. Another object of the present invention is to prevent the nitride semiconductor substrate from warping. Still another object of the present invention is to facilitate removing a substrate made of a different material from the nitride semiconductor substrate.

DISCLOSURE OF THE INVENTION

In order to solve the problems described above, a nitride semiconductor substrate according to the first invention comprises (A) a supporting substrate, (B) a first nitride semiconductor layer having periodically arranged T-shaped cross section formed by laterally growing nitride semiconductor films starting at portions formed in a periodical stripe, grid or island configuration provided on the surface of the supporting substrate and stopping the lateral growth before the films join together, and (C) a second nitride semiconductor layer which is grown from the top surface or the top and side surface, which side surface has been grown laterally, of the first nitride semiconductor layer as the core and covers the entire surface of the supporting substrate, wherein cavities are formed under the joint of the second nitride semiconductor layer.

The nitride semiconductor substrate having such a structure as described above can be manufactured by (A) forming a protective film having windows of stripe, grid or island configuration on the supporting substrate, (B) laterally growing the first nitride semiconductor over the protective film from the exposed portions of the supporting substrate and stopping the growth in such a state as the protective film is not covered, (C) removing the protective film thereby to form cavities below the first nitride semiconductor layer which has been grown laterally, and (D) growing the second nitride semiconductor layer laterally from the top surface or the top and side surface, which side surface is the portion grown laterally, of the first nitride semiconductor layer. The supporting substrate may be either a substrate made of a different material such as sapphire or a different-material substrate covered with a nitride semiconductor layer over the entire surface thereof. In case a substrate made of sapphire or the like is used, it is preferable to form a low temperature-grown buffer layer on the substrate before growing the first nitride semiconductor. In case the second nitride semiconductor layer grows from the top surface of the first nitride semiconductor layer, the step of removing the protective film may be omitted since both parts of the second nitride semiconductor layer join with each other above the cavity even when the protective film is not removed.

According to the first aspect of the present invention, the nitride semiconductor without voids can be grown, even when forming the protective film widely. Also, strain can be suppressed which would otherwise be generated when the second nitride semiconductor is grown from the side surface of the first nitride semiconductor, because the second nitride semiconductor layer grows over the cavity. Moreover, since the front surface of the growing crystal does not tilt as in the case of growing on the protective film, concentration of dislocations in the joint can be relieved.

Also, it is made easier to locate the joint even from above the top surface of the second nitride semiconductor layer which covers the entire surface of the substrate, because such a cavity exists below the joint of the second nitride semiconductor layer that has a refractive index which is significantly different from that of the nitride semiconductor. Since the cavity relieves the strain, warping of the substrate due to the difference in the thermal expansion coefficient between the substrate and the nitride semiconductor layer can be mitigated.

Moreover, because the nitride semiconductor layer is supported by the discontinuous pillar-like structure on the supporting substrate, bonding strength between the nitride semiconductor layer and the supporting substrate decreases. As a result, not only the conventional method employing excimer laser, but also mechanical peeling technique such as vibration or thermal impact maybe used to remove the supporting substrate. The supporting substrate can be mechanically peeled off, for example, by polishing the supporting substrate on the back surface thereof and making use of the vibration generated during polishing. During polishing, the whole supporting substrate is peeled off by the vibration. When the mechanical peeling technique is employed, the supporting substrate can be removed in a shorter period of time. Although an interface where the peeling occurs tend to varies, uniform nitride semiconductor substrate can be obtained by polishing the supporting substrate on the back surface thereof after peeling.

When a different-material substrate covered by the nitride semiconductor layer is used as the supporting substrate, the nitride semiconductor layer covering the different-material substrate may be (a) a nitride semiconductor buffer layer grown at a temperature lower than the temperature at which the nitride semiconductor layer is to be grown thereafter (hereinafter called low temperature-grown buffer layer); (b) a laminate of a low temperature-grown buffer layer and a gallium nitride layer; (c) a laminate of a low temperature-grown buffer layer, a gallium nitride layer and an aluminum gallium nitride layer; or (d) a laminate of a low temperature-grown buffer layer, a gallium nitride layer and an indium gallium nitride layer.

Among the constitutions described above, use of nitride semiconductor layer (c) (=the laminate of low temperature-grown buffer layer, gallium nitride layer and aluminum gallium nitride layer) has an effect of suppressing a decomposition of the nitride semiconductor layer on the supporting substrate surface in the subsequent process thereby to prevent the generation of V-shaped grooves which would otherwise be generated in the supporting substrate surface. It is also made easier to peel off the supporting substrate by utilizing the stress generated by the difference in thermal expansion coefficient between the gallium nitride layer and the aluminum gallium nitride layer. When nitride semiconductor layer (d) (=the laminate of a low temperature-grown buffer layer, a gallium nitride layer and an indium gallium nitride layer) is used, peeling off the supporting substrate is made easier by utilizing the fact that the indium gallium nitride layer has mechanical strength weaker than that of the gallium nitride.

Windows of stripe, grid or island configuration are formed on the protective film on the supporting substrate. It is preferable to form windows of grid or island configuration. When the windows of grid or island configuration are formed, the first nitride semiconductor layer grows in many directions in the plane thus making it easier to peel off the supporting substrate. It is more preferable to form the windows of grid configuration so that the protective film surrounded by the window has polygonal or circular shape. When the area of the protective film surrounded by the window is formed in polygonal or circular shape, the joint of the second nitride semiconductor layer becomes a point at the center of the protective film thus making it possible to minimize the area of the joint where dislocations are concentrated.

While the protective film is removed after growing the first nitride semiconductor layer, the protective film may not be completely removed and it suffices to remove the protective film in such a manner as at least a cavity is formed under the joint of the second nitride semiconductor layer. For example, the protective film may be removed only from under the joint, or just be reduced its thickness.

The protective film may be removed by dry etching or wet etching, in either way the protective film can be removed without degrading the crystallinity of the nitride semiconductor. Dry etching is capable of easily controlling the depth of the protective film to be removed.

When the protective film is removed so as to expose the surface of the supporting substrate, the problems caused by the decomposition of the protective film while growing the nitride semiconductor on the protective film, namely abnormal growth and degradation of crystallinity of the nitride semiconductor can be mitigated.

The protective film is made of silicon oxide, silicon nitride, titanium oxide or zirconium oxide, or a multi-layered film of these materials or a film made of a metal having a high melting point not lower than 1200° C. Since such a material for the protective film has the property of not allowing nitride semiconductor to grow easily thereon, the protective film is preferably used for growing the nitride semiconductor laterally thereon.

The nitride semiconductor substrate according to the second invention has a nitride semiconductor layer which is grown laterally starting at portions of the substrate formed in a periodical stripe or grid configuration provided on the surface of the supporting substrate, wherein the two films of the nitride semiconductor layer grown from the respective starting points do not join with each other but oppose each other via a clearance.

Thus the nitride semiconductor substrate of the present invention is characterized by the configuration of the two films of the nitride semiconductor layer, grown from the respective starting points, not joining with each other but disposed to oppose each other via a clearance, on the contrary to the conventional wisdom of the laterally grown substrate. We found that, even in the case of the nitride semiconductor substrate whereon the two films of the nitride semiconductor layer grown laterally are disposed to oppose each other via a clearance, crystal to make such a device as laser or LED can be grown flatly by the vapor phase epitaxial process. We also found that, since the epitaxial growth is started in such a state as there is no joint where dislocations would be concentrated, there occurs no generation of pits due to the dissociation of nitrogen when the substrate is heated which has been a problem in the prior art. Further, it is made possible to grow a flat device layer having better crystallinity than those obtained by the prior art.

The nitride semiconductor substrate having such a structure as described above can be manufactured by, for example, forming a protective film having stripe, grid or island-like configuration on the supporting substrate, laterally growing the nitride semiconductor over the protective film from the exposed portions of the supporting substrate and stopping the growth in such a state as the protective film is not completely covered. The supporting substrate maybe either a substrate made of a different material such as sapphire or a different-material substrate covered with a nitride semiconductor layer over the entire surface thereof.

It is preferable to form cavities by removing the protective film under the laterally-grown nitride semiconductor. Forming the cavities makes it easier to locate the clearance in the subsequent device forming process. Also the strain generated by difference of the coefficients of thermal expansion between the different-material substrate and the nitride semiconductor can be mitigated, thereby to suppress the warping of the nitride semiconductor substrate. Preferable structure and composition of the supporting substrate, material and shape of the protective film and method of removing the protective film are similar to those of the first investment.

The nitride semiconductor substrate of the present invention may comprises (A) the nitride semiconductor layer having low density of dislocations obtained according to the first invention or the second invention, (B) a thick nitride semiconductor layer for dispersing dislocations of the nitride semiconductor layer which has grown by halide vapor phase epitaxy process (hereinafter called the HVPE process), and (C) a nitride semiconductor layer formed by the similar way as the first invention or the second invention. In the nitride semiconductor layer obtained according to the first invention or the second invention, dislocations remain above the windows of the protective film. By dispersing the dislocations by means of the thick nitride semiconductor layer formed by the HVPE growing process, the nitride semiconductor layer can be made to have a relatively low dislocation density over the whole area. By growing the layers according to the first invention or the second invention on the base of the HVPE grown nitride semiconductor layer, a nitride semiconductor substrate having even lower density of dislocations can be obtained.

BEST MODE FOR CARRYING OUT THE INVENTION

Now the present invention will be described in detail below with reference to the accompanying drawings.

Embodiment 1

The first embodiment will be described below in relation to the nitride semiconductor substrate according to the first invention. FIG. 1A through FIG. 1D are schematic drawings showing stepwise an example of method for manufacturing the nitride semiconductor substrate according to the first invention.

Figure 1A:
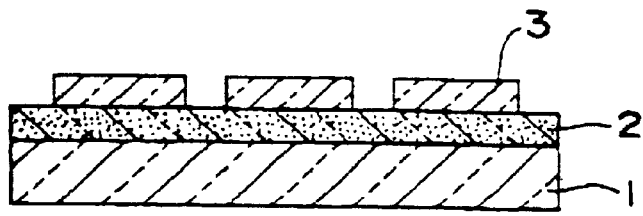
FIG. 1A through FIG. 1D are schematic sectional views showing a method for manufacturing a nitride semiconductor substrate of Embodiment 1.

FIG. 1A is a schematic sectional view showing the process of growing the nitride semiconductor on a different-material substrate 1 and forming stripes of the protective film.

The substrate 1 of different material may be made of an insulating substance such as sapphire or spinel ($MgAl_2O_4$) having principal plane in the C plane, R plane or A plane, or SiC (6H, 4H, 3C), ZnS, ZnO, GaAs, Si or an oxide that has lattice constant similar to the nitride semiconductor.

Alternatively, a buffer layer (not shown) may be formed on the substrate 1 before growing the nitride semiconductor 2 on the substrate 1. The buffer layer may be AlN, GaN, AlGaN, InGaN or the like. The buffer layer is grown to a thickness in a range from 0.5 μm to 10 Å at a temperature in a range from 300 to 900° C. This is for the purpose of mitigating the mismatch of lattice constant between the substrate 1 and the nitride semiconductor 2, and is preferable in order to reduce crystal defects.

The nitride semiconductor 2 formed on the substrate 1 may be made of undoped GaN or GaN doped with an n-type impurity such as Si, Ge, Sn or S. The nitride semiconductor 2 is formed on the substrate 1 at a temperature in a range from 900 to 1000° C. to a thickness preferably 1.5 μm or greater which makes it possible to form a specular surface with less pits on the crystal surface and is therefore desirable. The nitride semiconductor 2 may also be formed by stacking a GaN film and an $Al_xGa_{1-x}N$ film ($0<x<1$, preferably $0<x\leqq 0.5$) or stacking a GaN film and an $In_yGa_{1-y}N$ film ($0<y\leqq 1$). Using these constitutions makes it easier to remove the substrate 1 by making use of the stress generated by the difference in the thermal expansion coefficient between the GaN film and the $Al_xGa_{1-x}N$ film and the low strength of the $In_{xy}Ga_{1-y}N$ film. In this case, the $Al_xGa_{1-x}N$ film and the $In_{xy}Ga_{1-y}N$ film may be doped with an n-type impurity or undoped.

The protective film 3 to be formed on a part of the surface of the nitride semiconductor 2 is made of a material which does not allow the nitride semiconductor to grow easily thereon. Preferably the protective film is made of an oxide or a nitride such as silicon oxide ($SiO_x$), silicon nitride ($Si_xN_y$), titanium oxide ($TiO_x$) or zirconium oxide ($ZrO_x$), or a multi-layered film of these materials.

In addition to the materials described above, a metal having a melting point not lower than 1200° C. such as tungsten and molybdenum may be used.

The protective film 3 is formed by CVD, sputtering or vapor deposition and then, with a resist film coated thereon, etched to form a stripe or grid configuration by photolithography process. By etching the protective film into a stripe or grid configuration, windows in the shape of stripes or islands are formed in the protective film. Alternatively, the protective film 3 may also be left to remain in the configuration of islands to form the windows of grid configuration in the protective film 3. Width of the stripe or grid of the protective film is not limited, while it is preferably in a range from 5 to 20 µm in the case of stripe. The window or opening in the protective film 3 preferably smaller than the stripe width. When the protective film is formed in the configuration of islands to form windows of grid configuration, the islands are made to a width of 10 µm or less, preferably 5 µm or less, and the grid-shaped windows are made to a width in a range from 10 to 30 µm, preferably from 10 to 20 µm.

There is no limitation to the thickness of the protective film since it is not necessary to form the first nitride semiconductor so as to cover the protective film completely, and the thickness may be in a range from 0.05 to 10 µm.

Figure 2A:
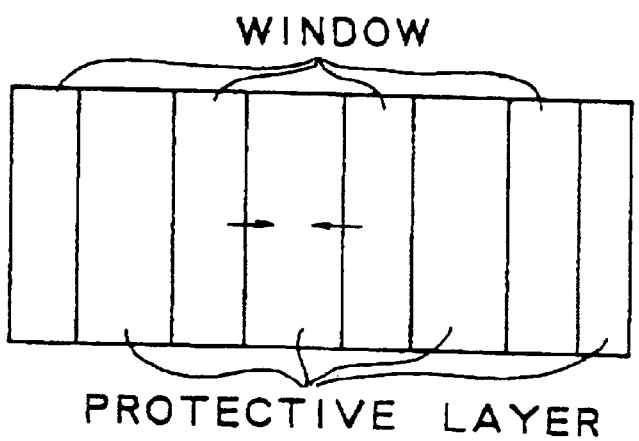
FIG. 2A through FIG. 2C are schematic drawings showing the pattern of a protective film.
Figure 2B:
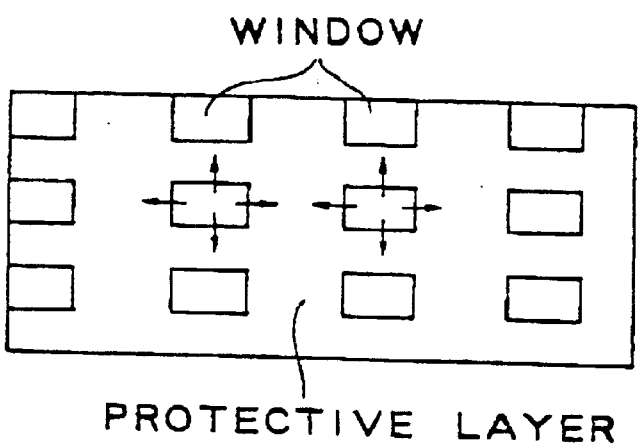
Figure 2C:
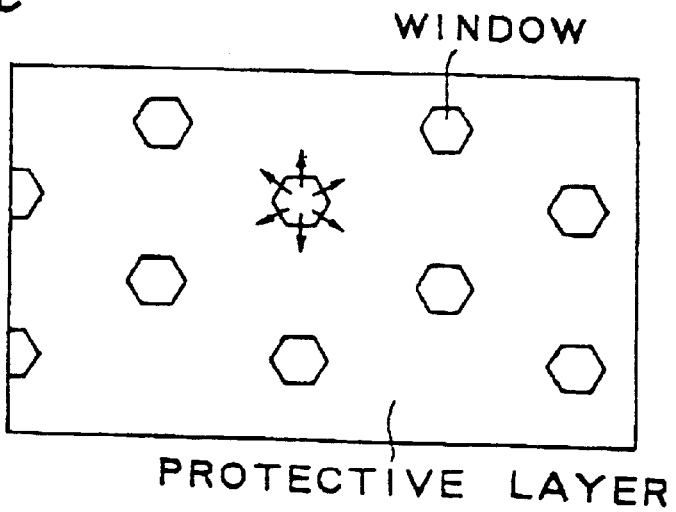

FIG. 2A through FIG. 2C and FIG. 3A through FIG. 3C are ton views of the substrate after etching. FIG. 2A shows a case where the protective film 3 to be formed on the nitride semiconductor 2 is etched in stripe configuration. FIG. 2B and FIG. 2C show cases where the protective film 3 is etched in grid configuration to form island-like windows. The island-like windows may be formed in polygon (triangle, rectangle, hexagon, etc.) as shown in FIG. 2B and FIG. 2C, or circle.

Figure 3A:
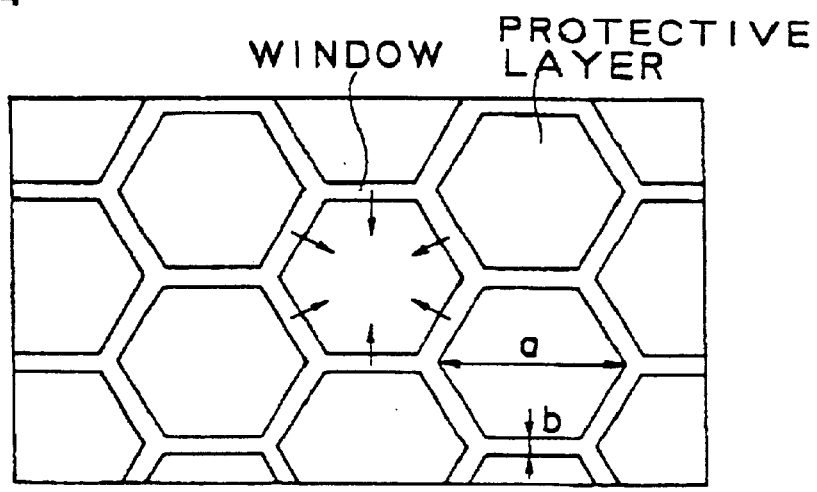
FIG. 3A through FIG. 3C are schematic drawings showing the pattern of a protective film.
Figure 3B:
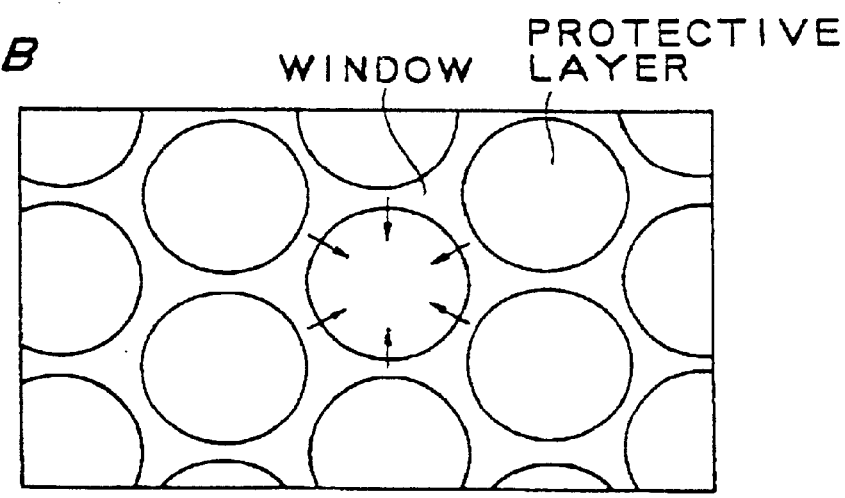
Figure 3C:
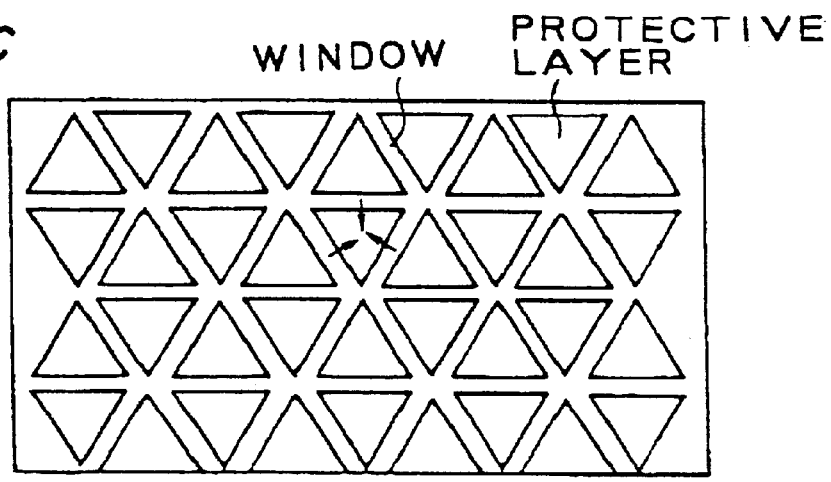

FIG. 3B and FIG. 3C show cases where the protective film 3 is left to remain in the configuration of islands to form the windows of grid configuration. The protective film 3 may be formed in polygon (triangle, rectangle, hexagon, etc.) as shown in FIG. 3A and FIG. 3C, or circle as shown in FIG. 3B. The islands of the protective film 3 are preferably disposed in a dense arrangement at constant intervals as far as possible. In FIG. 3A, for example, hexagonal islands of the protective film 3 are arranged in honeycomb configuration (one side each of adjacent hexagons oppose each other, with each hexagon surrounded by six hexagons), while in FIG. 3C one side each of adjacent triangle oppose each other while six triangles form one hexagon and the hexagons are disposed in honeycomb arrangement. With these arrangements, distance between the islands of the protective film 3 (width of window) can be made uniform and the islands of the protective film 3 can be arranged with a high density. The protective film 3 is not limited to the configuration shown in FIG. 2 and FIG. 3, and may have any configuration as long as the nitride semiconductor 2 is exposed periodically.

Forming the windows in the protective film 3 in the configuration of islands as shown in FIG. 2A and FIG. 2C or grid as shown in FIG. 3A through FIG. 3C has such an advantage as it is made easier to peel off the supporting substrate under the first nitride semiconductor layer 4 since the subsequent growth of the first nitride semiconductor layer 4 occurs in many direction (indicated by arrows in the drawing).

Forming the windows of grid configuration by leaving the protective film 3 in the configuration of islands as shown in FIG. 3 has such an advantage that the joint of the second nitride semiconductor layer 5 to be grown later becomes a point at the center of the protective film 3 thus making it possible to minimize the area of the joint where dislocations are concentrated.

Figure 4:
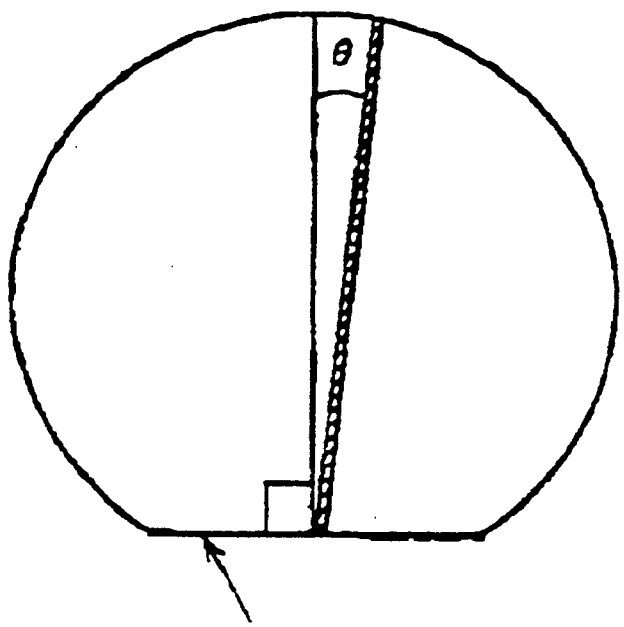
FIG. 4 is a plan view on the principal plane side of a substrate showing that the stripe protective film is formed in such a state as the direction of stripe is offset a little from the orientation flat surface.

In case the protective film is formed in stripes, good crystal of flat growth surface can be obtained by arranging the stripes as shown in FIG. 4 with the orientation flat surface being set in the A plane of sapphire with the direction of growth being set at an angle θ=0.1 to 1° to the left or right from the normal direction of the orientation flat surface.

Figure 1B:
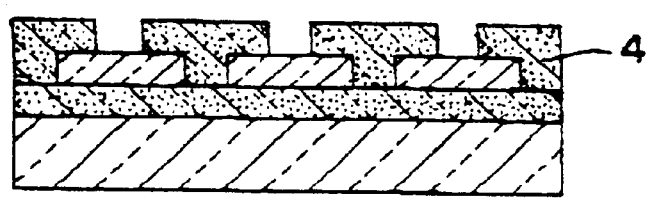

Then as shown in FIG. 1B, the first nitride semiconductor 4 is grown through the windows in the protective film using the nitride semiconductor 2 as the core, and the lateral growth of the first nitride semiconductor 4 on the protective film 3 is stopped before the protective film 3 is completely covered. The first nitride semiconductor 4 which has grown in this way has a cross sectional of periodical T configuration as shown in FIG. 1B.

While there is no limitation to the first nitride semiconductor 4 to be grown on the nitride semiconductor 2 formed on the protective film 3, nitride semiconductor of GaN is preferable.

The first nitride semiconductor 4 may be doped with p-type impurity or n-type impurity, or undoped.

Preferable thickness of the first nitride semiconductor 4 depends on the thickness and size of the protective film 3. Since it is necessary to have a portion of good crystallinity laterally grown on the surface of the protective film, the first nitride semiconductor 4 is preferably grown to have a thickness at least 1.5 times larger that of the protective film and in a range from 1.5 to 2 µm.

Figure 1C:
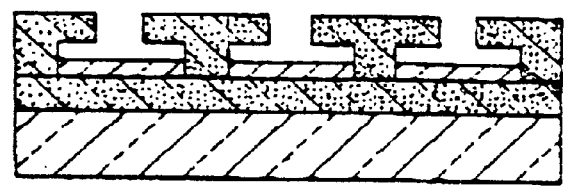

Then as shown in FIG. 1C, in the state that lateral growth of the first nitride semiconductor 4 on the protective film 3 is stopped midway, the protective film is removed.

The protective film can be removed by etching. While there is no limitation to the etching process, dry etching or wet etching may be employed. Isotropic dry etching will make it easier to control the etching process.

By removing the protective film, a cavity is formed under a portion of the first nitride semiconductor 4 which has grown laterally. As a result, in the nitride semiconductor which is grown on the first nitride semiconductor 4, generation of stress in the interface with the protective film during growth from the side surface of the first nitride semiconductor.

Figure 1D:
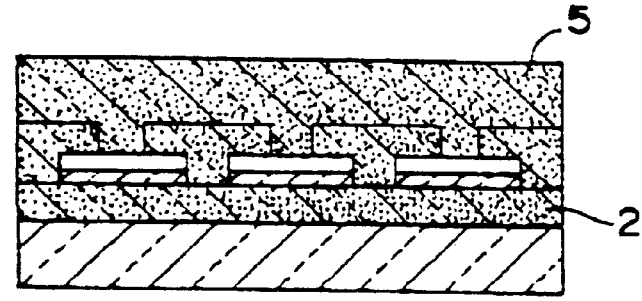

Then as shown in FIG. 1D, on the first nitride semiconductor 4 from which the protective film 3 has been removed, a second nitride semiconductor 5 is grown from the top surface and the side surface of the first nitride semiconductor 4.

The second nitride semiconductor 5 may be made of undoped GaN, GaN doped with an n-type impurity such as Si, Ge, Sn or S or GaN doped with an p-type impurity such as Mg. The second nitride semiconductor 5 is grown at a temperature in a range from 900 to 1100° C. Among the materials described above, Mg-doped makes the second nitride semiconductor 5 easier to fill the clearance in the first nitride semiconductor 4 and is preferable. On the other hand, undope provides a stable electric property. Since the second nitride semiconductor 5 grows above the cavity, $Al_xGa_{1-x}N$ (0<x<1) may also be used which cannot be used in the prior art because of low selectivity for the growth on a protective film.

Thickness of the second nitride semiconductor 5 is preferably in a range from 5 to 20 $\mu$m in the case of GaN, and in a range from 2 to 15 $\mu$m in the case of $Al_xGa_{1-x}N$.

The second nitride semiconductor layer 5 may have multi-layered structure, which is preferably a super-lattice structure. The thickness of each layer is preferably 10 Å~2 $\mu$m. When the second nitride semiconductor layer 5 is multi-layered, it may also play a role as a functional layer of a device, for example, contact layer or even cladding layer. This reduces the whole thickness of the device and, therefore, suppress warping of the device. Another advantage of the multi-layered structure is preventing dislocations from proceeding in the upright direction. $GaN/Al_xGa_{1-x}N$ (0<x<1) multi layer is preferable for the second nitride semiconductor 5, because $Al_xGa_{1-x}N$ is grown under such a condition as accelerating the lateral growth and effectively prevents the upward proceeding of dislocations. For example, GaN and $Al_xGa_{1-x}N$ pair each having 200 Å thickness is repeated 50 times as super lattice layer.

Since the second nitride semiconductor 5 is grown from the top and side surface of the first nitride semiconductor having good crystallinity which has been obtained by lateral growth, crystal defects are eliminated in the second nitride semiconductor, with crystal defects remaining only above the windows of the protective film 3. While FIG. 1D shows a case of growing the second nitride semiconductor 5 laterally from the top surface and the side surface of the first nitride semiconductor 4 as the core, the second nitride semiconductor 5 may also be grown only from the top surface of the first nitride semiconductor 4. When the second nitride semiconductor 5 is grown from the top surface of the first nitride semiconductor 4, the step of removing the protective film may be omitted since both parts of the second nitride semiconductor layer join with each other above the cavity even when the protective film is not removed.

Figure 5:
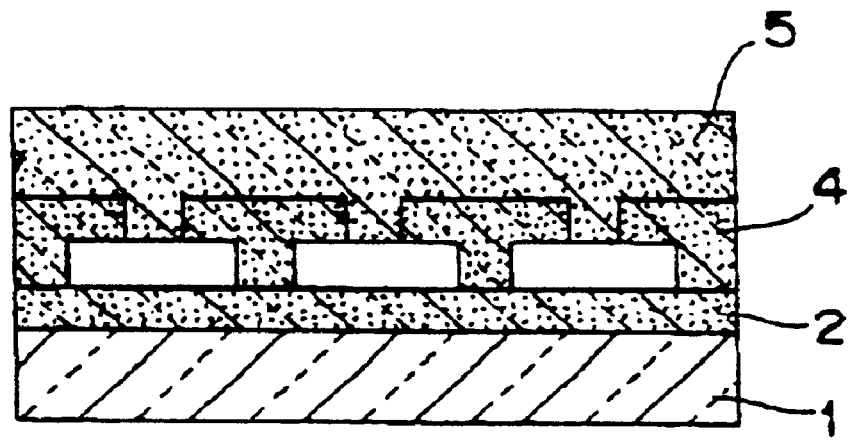
FIG. 5 is a sectional view schematically showing another example of the nitride semiconductor of Embodiment 1.

By removing the protective film 3 completely so as to expose the nitride semiconductor 2 as shown in FIG. 5, such a trouble can be prevented as the protective film made of $SiO_2$ or the like decomposes at a temperature above 1000° C. and diffuses into the nitride semiconductor located on the protective film when a device is formed on the substrate. Thus such a problem is solved as the intrusion of decomposed $SiO_2$ into the nitride semiconductor causes degradation of crystallinity or abnormal growth.

Also even in the case of growing the second nitride semiconductor 5 laterally from the top surface and the side surface of the first nitride semiconductor with the protective film having been completely removed, cavities remain in the second nitride semiconductor and suppress the propagation of the crystal defects from the nitride semiconductor 2 which includes many crystal defects.

Figure 6:
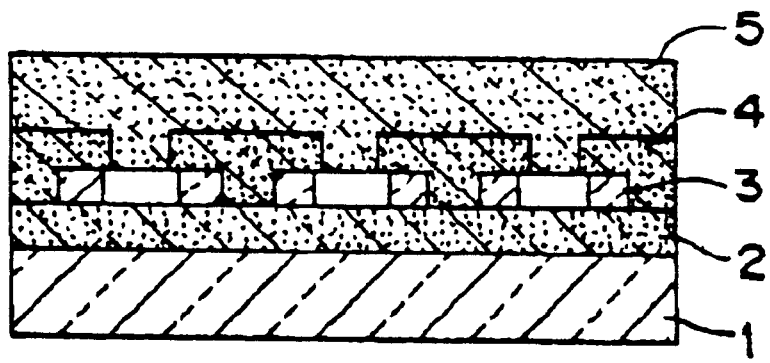
FIG. 6 is a sectional view schematically showing still another example of the nitride semiconductor substrate of Embodiment 1.

As shown in FIG. 6, the protective film 3 may be removed until the nitride semiconductor 2 is exposed with a part of the protective film 3, like column, being left under a portion of the laterally-grown first nitride semiconductor 4. In this case, too, such a trouble can be prevented as the protective film made of $SiO_2$ or the like decomposes at a temperature above 1000° C. and diffuses into the nitride semiconductor located on the protective film when a reactive device is formed on the substrate, which leads to degradation of crystallinity or abnormal growth. In the aspect of the invention shown in FIG. 5 and FIG. 6, surface of the nitride semiconductor 2 exposed through the protective film 3 decomposes during the process, and V-shaped grooves tend to be generated in the nitride semiconductor 2. Formation of the V-shaped grooves due to decomposition of the nitride semiconductor 2 may cause contamination of the first and second nitride semiconductors 4, 5. Formation of the V-shaped grooves, however, may contributes to making it easier to peel off the supporting substrate, and also to suppress dislocations In the joint of second nitride semiconductors 5. In order to form the V-shaped grooves intentionally, surface of the nitride semiconductor layer 2 is preferably gallium nitride or indium gallium nitride. In order to suppress the formation of the V-shaped grooves, surface of the nitride semiconductor layer 2 is preferably aluminum gallium nitride.

Figure 7:
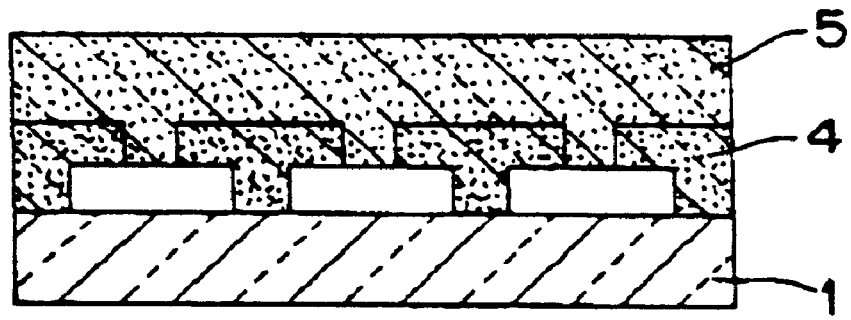
FIG. 7 is a sectional view schematically showing yet another example of the nitride semiconductor substrate of Embodiment 1.

The nitride semiconductor substrate may also be made by growing the protective film 3 without growing the nitride semiconductor 2 on the substrate 1 as shown in FIG. 7.

The nitride semiconductor substrate according to this embodiment has such features that (1) the concentration of dislocations in the joint of the nitride semiconductor is mitigated, (2) it is easy to locate the joint and (3) warping is suppressed. Therefore, it is made easy to manufacture nitride semiconductor devices such as semiconductor laser. When a semiconductor laser is manufactured, stripes provided for the purpose of controlling the transverse mode of the semiconductor laser are preferably formed in an area between the starting point of growing the first nitride semiconductor 4 and the joint of the second nitride semiconductor 5. The number of dislocation in this area is not more than $10^7$ cm$^{-2}$. This is because the region which has becomes the starting point of growing the first nitride semiconductor 4, namely the window region of the protective film 3 has a high density of dislocations and the joint of the second nitride semiconductor 5 has a higher density of dislocations than the other portions though significantly made lower compared to the prior art. Ridges in the case of a ridge wave guide semiconductor laser, or buried stripes in the case of a buried hetero-junction semiconductor laser, are formed in an area between the starting point of growing the first nitride semiconductor 4 and the joint of the second nitride semiconductor 5. Since dislocation density of the joint region is made lower compared to the prior art, it is possible to form the stripe configuration of the laser much nearer to the joint, thus extending a life of the laser device.

Embodiment 2

Figure 8A:
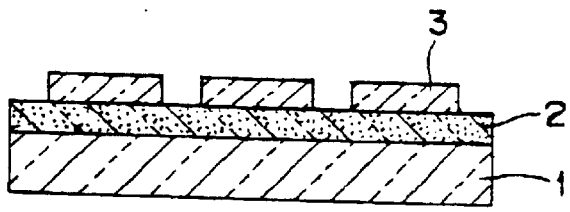
FIG. 8 is a schematic sectional view showing a process for manufacturing a nitride semiconductor substrate of Embodiment 2.
Figure 8B:
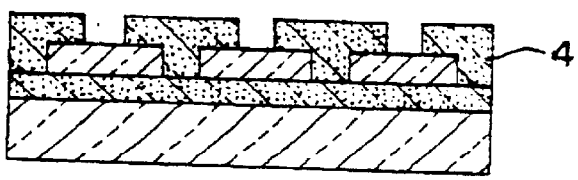
Figure 8C:
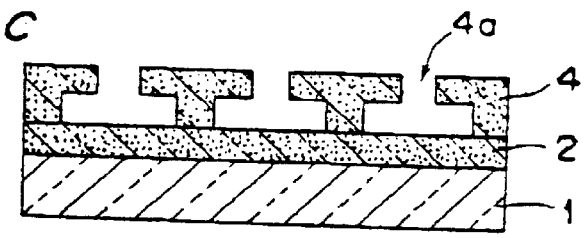

The second embodiment will be described below in relation to the nitride semiconductor substrate according to the second invention. FIG. 8A through FIG. 8C show an example of a method for manufacturing the nitride semiconductor substrate according to the second invention. The process shown in FIG. 8A through FIG. 8C is similar to that of the first embodiment shown in FIG. 1A through FIG. 1C, and the manufacturing conditions described in conjunction with FIG. 1A through FIG. 1C can be applied to this process. FIG. 8A is a schematic sectional view showing the process of growing the nitride semiconductor on the substrate 1 made of different material and forming stripes of the protective film. A buffer layer (not shown) may be formed on the substrate 1 before growing the nitride semiconductor 2 on the substrate 1.

Then as shown in FIG. 8B, the first nitride semiconductor 4 is grown through the windows in the protective film using the nitride semiconductor 2 as the core, and the lateral growth of the first nitride semiconductor 4 on the protective film 3 is stopped before two areas of the first nitride semiconductor 4 growing from adjacent windows join with each other and the protective film 3 is completely covered.

Although the nitride semiconductor substrate in the state of FIG. 8B may be used as the substrate, it is more preferable to remove the protective film 3 as shown in FIG. 8C. By removing the protective film 3 so as to expose the nitride semiconductor 2, such a trouble can be prevented as the protective film made of $SiO_2$ or the like decomposes at a temperature above 1000° C. and diffuses into the nitride semiconductor located on the protective film when a reactive device is formed on the substrate. Thus such a problem is solved as the intrusion of decomposed $SiO_2$ into the nitride semiconductor causes degradation of crystallinity or abnormal growth. Also since the cavities are formed under the first nitride semiconductor 4 after forming the device as the protective film 3 is removed, the device pattern can be formed while recognizing the clearance 4a. Moreover, the nitride semiconductor substrate can be restricted from warping by relieving the strain between the substrate 1 and the nitride semiconductor layer 4.

The nitride semiconductor substrate formed as described above has such a configuration as separate portions of the nitride semiconductor layer 4 which have grown laterally do not join each other and the nitride semiconductor layer 4 has the cross section of periodical T shape. That is, while there is the clearance 4a between separate portions of the nitride semiconductor layer 4 on the top layer of the substrate, the nitride semiconductor layer can be epitaxially grown in a flat configuration even on the nitride semiconductor layer which is not a continuous sheet.

Figure 9A:
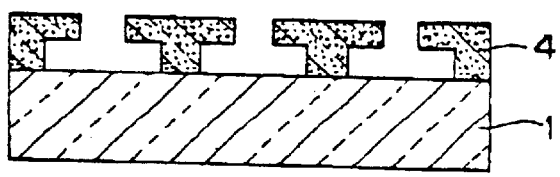
FIGS. 9A and 9B are sectional views schematically showing a manufacturing process to form a device on the nitride semiconductor substrate shown in FIG. 8.
Figure 9B:
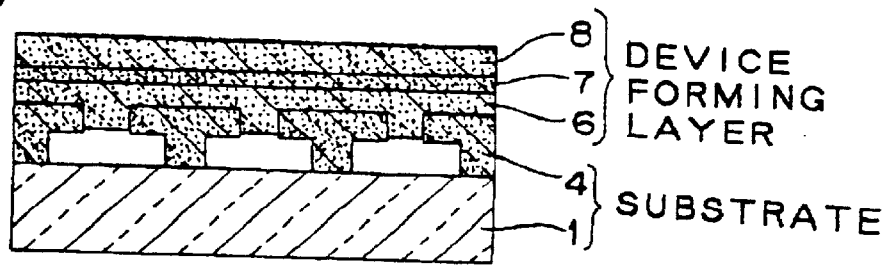

FIGS. 9A and 9B are schematic drawings showing the process of manufacturing the nitride semiconductor device by epitaxially growing a device forming layer on the nitride semiconductor substrate obtained by the method shown in FIG. 8. First, as shown in FIG. 9A, the nitride semiconductor substrate obtained by the method shown in FIG. 8 is put in a vapor phase epitaxial growing apparatus, and is heated to about 900 to 1200° C. which is suited for growing the nitride semiconductor. In this heating process, pits are not generated in the nitride semiconductor substrate of this embodiment since the separate portions of the nitride semiconductor layer 4 which have grown laterally do not join each other. In the prior art process, pits are generated in the surface of the nitride semiconductor substrate before reaching the growing temperature of the nitride semiconductor because of dissociation of nitrogen in the joint of lateral growth where dislocations are concentrated.

Then as shown in FIG. 9B, an n-type contact layer 6 is formed directly on the nitride semiconductor substrate, and a nitride semiconductor layer 7 including an n-type cladding layer, an active layer and a p-type cladding layer is formed by continuous epitaxial growth. The n-type contact layer 6 and the nitride semiconductor layer 7 formed thereon constitute the nitride semiconductor device such as laser or LED. By forming the n-type contact layer 6 to a large thickness, the clearance in the nitride semiconductor layer 4 can be filled in thereby to form a flat surface. The n-type contact layer 6 can be made of, for example, $Al_xGa_{1-x}N$ ($0 \leq x<0.5$) of which thickness is preferably in a range from 5 to 10 $\mu$m. The entire device forming layer including the n-type contact layer 6 is preferably grown continuously while keeping the nitride semiconductor growing temperature in a range from 900 to 1200° C. Instead of forming the n-type contact layer 6 directly on the nitride semiconductor substrate, the n-type contact layer 6 may also be formed after growing a buffer layer made of nitride semiconductor such as GaN on the nitride semiconductor substrate at temperature in a range from 900 to 1200° C. Also instead of directly forming the n-type contact layer 6, the n-type contact layer 6 may also be formed after growing a nitride semiconductor layer (preferably GaN layer) doped with Mg. Since the nitride semiconductor layer doped with Mg is easier to grow laterally, the clearance 4a in the nitride semiconductor substrate can be efficiently filled in.

When a semiconductor laser is constituted from the n-type contact layer 6 and the nitride semiconductor layer 7, stripes provided for the purpose of controlling the transverse mode of the semiconductor laser are preferably formed in an area between the starting point of growing the first nitride semiconductor 4 and the joint of the second nitride semiconductor 5. The number of dislocation in this area is not more than $10^7$ cm$^{-2}$. This is because the region which has becomes the starting point of growing the first nitride semiconductor 4, namely the window of the protective film 3 has a high density of dislocations and the center of the clearance 4a between adjacent portions of the nitride semiconductor 4 has a higher density of dislocations than the other portions. Ridges in the case of a ridge waveguide semiconductor laser, or buried stripes in the case of a buried hetero-junction semiconductor laser, are formed between the starting point of growing the first nitride semiconductor 4 and the center of the clearance 4a of the nitride semiconductor layer 4.

Figure 10:
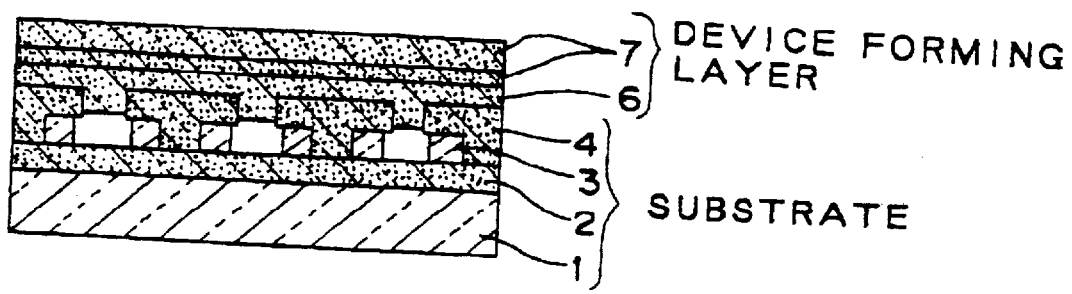
FIG. 10 is a sectional view schematically showing a nitride semiconductor device using a nitride semiconductor substrate of another example of Embodiment 2.
Figure 11:
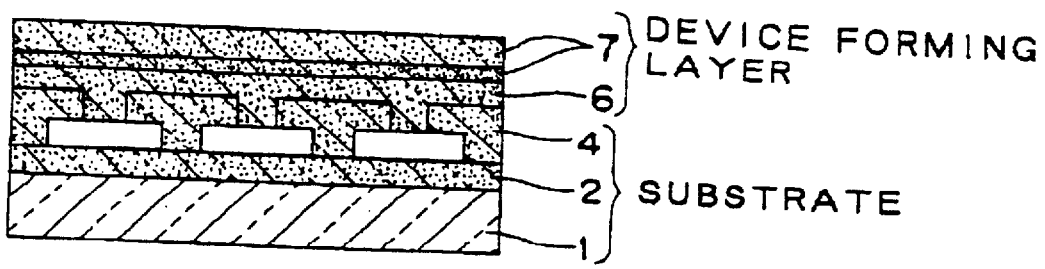
FIG. 11 is a sectional view schematically showing a nitride semiconductor device using a nitride semiconductor substrate of still another example of Embodiment 2.

While it is preferable to completely remove the protective film 3 made of $SiO_2$ or the like so as to expose the nitride semiconductor 2 as shown in FIG. 8C, a part of the protective film 3 may be left like column to remain below the portion of the first nitride semiconductor 4 as shown in FIG. 10. In this case, too, such a trouble can be prevented as the protective film made of $SiO_2$ or the like decomposes at a temperature above 1000° C. and diffuses into the nitride semiconductors 6, 7 located on the protective film 3 thus leading to degradation of crystallinity or abnormal growth when a reactive device is formed on the substrate.

The nitride semiconductor substrate may also be manufactured by laterally growing the first nitride semiconductor layer 4 directly without growing the nitride semiconductor 2 on the substrate 1 and stopping the lateral growth before the entire surface of the substrate is covered. Preferable structure and composition of the supporting substrate, material and shape of the protective film and method of removing the protective film are similar to those of the first investment.

Embodiment 3

Figure 12A:
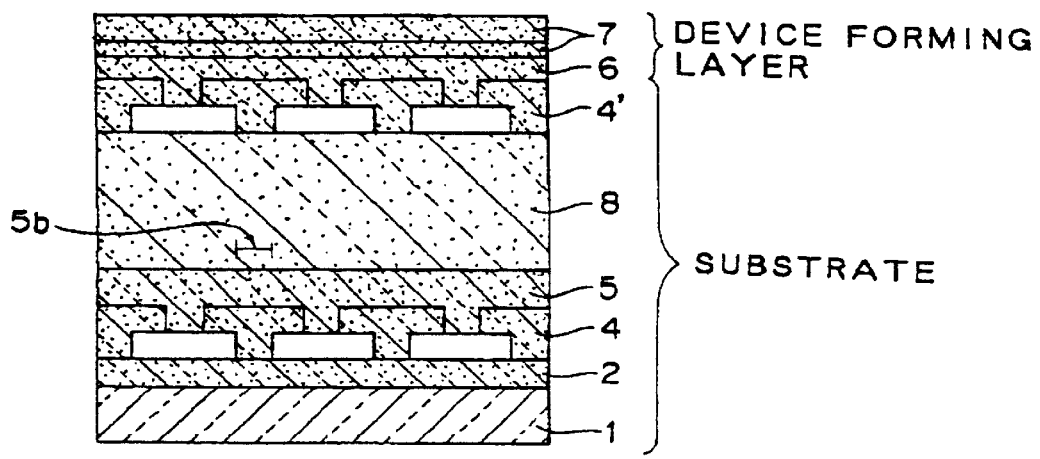
FIGS. 12A and 12B are sectional views schematically showing a nitride semiconductor substrate of Embodiment 3.
Figure 12B:
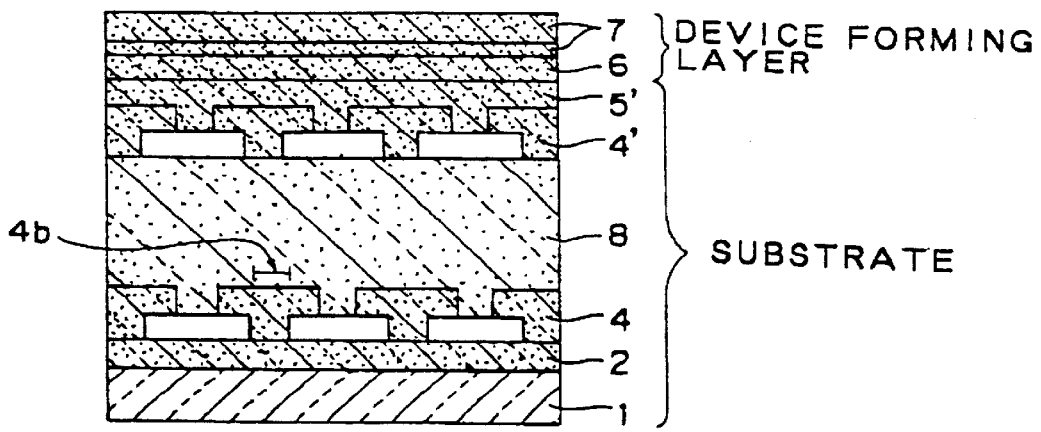
Figure 13:
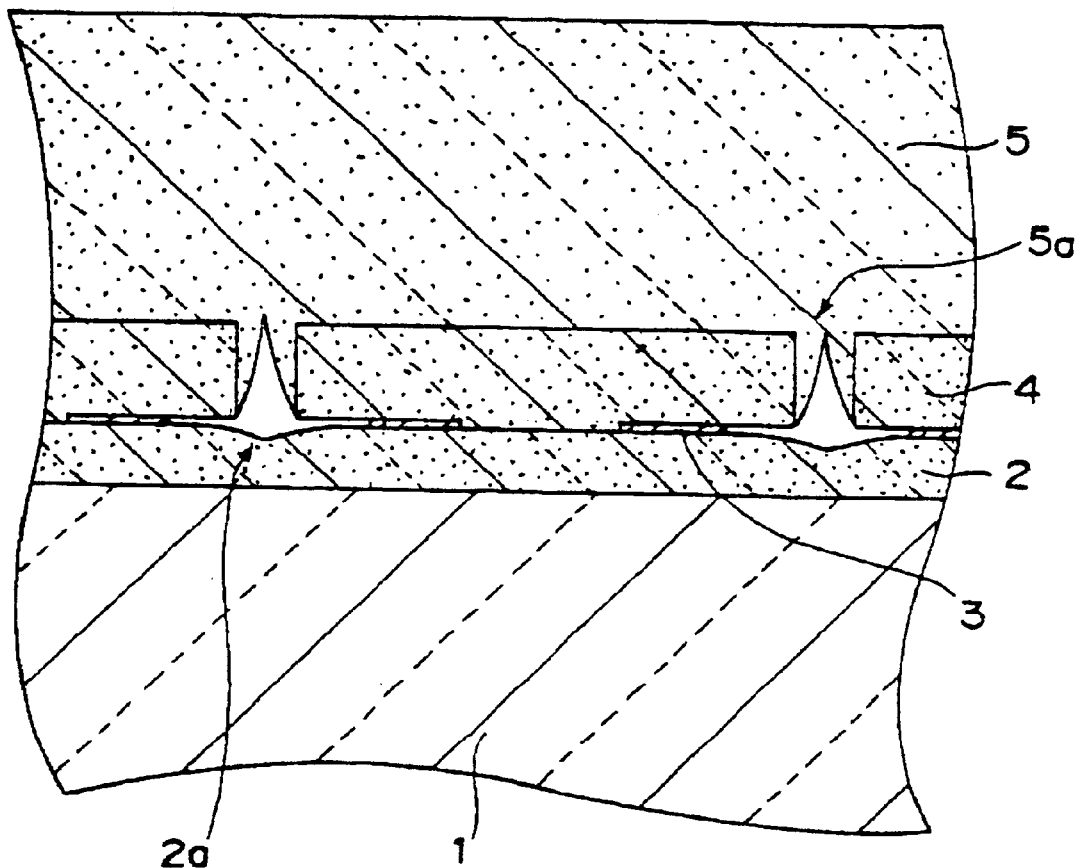
FIG. 13 is a schematic sectional view of the nitride semiconductor substrate in FIG. 6 showing more detail of the joint portion.

FIG. 12A and FIG. 12B are schematic sectional view sowing a nitride semiconductor substrate according to the third embodiment of the present invention. In this embodiment, a thick nitride semiconductor layer 8 is grown by the HVPE process for dispersing dislocations on a nitride semiconductor layer which is obtained by the process of the first or second embodiment (hereinafter first lateral growth), then a nitride semiconductor layer is grown by a method similar to those of the first or second embodiment (hereinafter second lateral growth), thereby constituting the nitride semiconductor substrate.

The first and the second lateral growth may be carried out by the method of either the first embodiment or the second embodiment. They may also be combined in any of four possible combinations. Two of these will be described below with reference to FIG. 12A and FIG. 12B.

FIG. 12A shows an example of the first lateral growth being carried out by a method similar to that of the first embodiment and the second lateral growth being carried out by a method similar to that of the second embodiment. The process is similar to that of the first embodiment up to the point of forming the nitride semiconductor layer 2, the first nitride semiconductor layer 4 and the second nitride semiconductor layer 5 on the substrate 1 made of sapphire or the like. Then the thick HVPE layer 8 is formed on the second nitride semiconductor layer 5. While dislocations are concentrated in a region 5b of the second nitride semiconductor layer 5 located above the window of the protective film 3, the dislocations are uniformly dispersed over the entire HVPE layer 8 due to the HVPE layer 8 being formed with a large thickness. Then the nitride semiconductor layer 4' having T-shaped cross section is formed on the HVPE layer 8 by a method similar to that of the second embodiment, and further the device forming layers 6 and 7 are formed.

FIG. 12B shows an example of the first lateral growth being carried out by a method similar to that of the second embodiment and the second lateral growth being carried out by a method similar to that of the first embodiment. The process is similar to that of the second embodiment up to the point of forming the nitride semiconductor layer 2, the first nitride semiconductor layer 4 having T-shaped cross section on the substrate 1 made of sapphire or the like. Then the thick HVPE layer 8 is formed on the nitride semiconductor layer 4 having T-shaped cross section. While dislocations are concentrated in a region 4b of the nitride semiconductor layer 4 located above the window of the protective film 3, the dislocations are uniformly dispersed over the entire HVPE layer 8 due to the HVPE layer 8 being formed with a large thickness. Then the first nitride semiconductor layer 4' and the second nitride semiconductor layer 5' are formed on the HVPE layer 8 by a method similar to that of the first embodiment, and further the device forming layers 6 and 7 are formed.

According to this embodiment, dislocations which remain in the nitride semiconductor layer obtained by the first lateral growth are dispersed uniformly by the thick nitride semiconductor layer 8 formed by the HVPR growing process and the second lateral growth is carried out on the base of the nitride semiconductor layer 8, thereby to obtain the nitride semiconductor substrate having even lower density of dislocations. Thick HVPE layer 8 is preferable to disperse the dislocation uniformly. The thickness of the HVPE layer is at least 10 μm, preferably not less than 50 μm, more preferably not less than 200 μm, still more preferably not less than 400 μm.

In the method for manufacturing the nitride semiconductor substrate of the present invention, there is no limitation to the method of growing the nitride semiconductor 2, the first nitride semiconductor 4 and the second nitride semiconductor. For example, such methods may be employed as MOVPE (metal-organic vapor phase deposition), HVPE (halide vapor phase deposition), MBE (molecular beam epitaxy) and MOCVD (metal-organic chemical vapor phase deposition).

While dry etching or wet etching may be employed for forming the windows in the protective film and removing the protective film, anisotropic etching is preferably employed for forming the windows and isotropic etching is preferably employed for removing the protective film.

Now Examples of the present invention will be described below, but the invention is not limited to these embodiments.

EXAMPLE 1

A sapphire substrate 1 having principal plane in C plane and orientation flat surface in A plane is used. A buffer layer of GaN is formed to a thickness of 200 Å on the sapphire substrate 1 at a temperature of 510° C. by MOCVD process using hydrogen as the carrier gas and ammonia and TMG (trimethyl-gallium) as the stock material gas.

After growing the buffer layer, supply of only the TMG is stopped and the temperature is raised to 1050° C. When the temperature has reached 1050° C. nitride semiconductor 2 made of undoped GaN is grown to a thickness of 2.5 μm by using TMG, ammonia and silane gas as the stock material gas.

A protective film 3 made of $SiO_2$ is formed to a thickness of 0.5 μm by the CVD process on the nitride semiconductor 2 and, after forming a photo-mask of stripe configuration, the protective film 3 made of $SiO_2$ having stripe width of 14 μm and window size of 6 μm is formed by etching. Direction of the stripes of the protective film 3 is set perpendicular to the sapphire A plane. The clearance of the two adjuscent nitride semiconductor 4 is about 2 μm.

Then the first nitride semiconductor 4 made of GaN is grown to a thickness of 2 μm at a temperature of 1050° C. under a reduced pressure by MOCVD process using TMG, ammonia, silane gas and $Cp_2Mg$ (cyclopentadienyl magnesium) as the stock material gas. In this process, the first nitride semiconductor 4 is grown from the window of the $SiO_2$ protective film and laterally grown on the protective film. The growth is stopped before the first nitride semiconductor 4 completely covers the $SiO_2$ protective film.

Then the $SiO_2$ protective film is etched to a depth of 0.3 μm by isotropic dry etching at a temperature of 120° C. using oxygen and CF4 as the etching gas.

The second nitride semiconductor 5 made of GaN is grown, from the side surface and the top surface of the first nitride semiconductor which has been laterally grown, to a thickness of 15 μm at a temperature of 1050° C. under atmospheric pressure by the MOCVD process using TMG, ammonia, silane gas and $Cp_2Mg$ (cyclopentadienyl magnesium) as the stock material gas. The reduced pressure may also be employed to grow the second nitride semiconductor 5.

CL (cathode luminescence) observation of the surface of the second nitride semiconductor 5 made as described above shows crystal defects over the windows of the protective film. However, few crystal defects are observed on the surface of the second nitride semiconductor 5 grown over the protective film, showing good crystallinity. The number of the defects is about $6 \times 10^6$ $cm^{-2}$.

EXAMPLE 2

A sapphire substrate 1 having principal plane in C plane and orientation flat surface in A plane is used. A buffer layer of GaN is formed to a thickness of 200 Å on the sapphire substrate 1 at a temperature of 510° C. by the MOCVD process using hydrogen as the carrier gas and ammonia and TMG (trimethyl-gallium) as the stock material gas.

After growing the buffer layer, a protective film 3 made of $SiO_2$ is formed on the buffer layer to a thickness of 0.5 μm by the CVD process and, after forming a photo-mask of stripe configuration, the protective film made of SiO$_2$ having stripe width of 14 μm and window size of 6 μm is formed by etching. Direction of the stripes of the protective film 3 is set perpendicular to the sapphire A plane.

Then the first nitride semiconductor 4 made of GaN is grown to a thickness of 15 μm at a temperature of 1050° C. under a reduced pressure by the MOCVD process using TMG, ammonia, silane gas and Cp$_2$Mg (cyclopentadienyl magnesium) as the stock material gas. In this process the first nitride semiconductor 4 is grown from the window of the SiO$_2$ protective film and laterally grown on the protective film. The growth is stopped before the first nitride semiconductor completely covers the SiO$_2$ protective film. The clearance of the two adjacent nitride semiconductor 4 is about 2 μm.

Then the SiO$_2$ protective film 3 is etched to a depth of 0.3 μm by isotropic etching at a temperature of 120° C. using oxygen and CF$_4$ as the etching gas.

The second nitride semiconductor 5 made of GaN is grown, from the side surface and the top surface of the first nitride semiconductor, to a thickness of 15 μm at a temperature of 1050° C. under atmospheric pressure by the MOCVD process using TMG, ammonia, silane gas and Cp$_2$Mg (cyclopentadienyl magnesium) as the stock material gas.

CL (cathode luminescence) observation of the surface of the second nitride semiconductor 5 made as described above provided similar results to Example 1.

EXAMPLE 3

The second nitride semiconductor is grown similarly to Example 1, except for etching the protective film till the first nitride semiconductor is exposed.

Satisfactory result substantially similar to Example 1 is obtained.

EXAMPLE 4

The second nitride semiconductor is grown similarly to Example 2, except for etching the protective film till the sapphire of the substrate is exposed.

Satisfactory result substantially similar to Example 2 is obtained.

EXAMPLE 5

The second nitride semiconductor is grown similarly to Example 2, except for growing the buffer layer after forming the protective film directly on the substrate. That is, with a sapphire substrate 1 having principal plane in C plane and orientation flat surface in A plane being used, a protective film made of SiO$_2$ is formed to a thickness of 0.5 μm by the CVD process on the sapphire substrate and, after forming a photo-mask of stripe configuration, the protective film made of SiO$_2$ having stripe width of 14 μm and window size of 6 μm is formed by etching. Direction of the stripes of the protective film 3 is set perpendicular to the sapphire A plane.

Then a buffer layer of GaN is formed to a thickness of 200 Å on the sapphire substrate 1 at a temperature of 510° C. by the MOCVD process using hydrogen as the carrier gas and ammonia and TMG (trimethyl-gallium) as the stock material gas. Then the first nitride semiconductor 4 made of GaN is grown to a thickness of 15 μm at a temperature of 1050° C. under a reduced pressure by the MOCVD process using TMG, ammonia, silane gas and Cp$_2$Mg (cyclopentadienyl magnesium) as the stock material gas.

In this case, while the buffer layer grows to a certain extent on the SiO$_2$ protective film as well on the sapphire, although the buffer layer on the SiO$_2$ film has poor film quality. As a result, the first nitride semiconductor 4 starts growing only from the portion of the buffer layer which has grown on the sapphire (window of the SiO$_2$) and grows laterally similarly to Example 2. Thus satisfactory result similar to Example 2 is obtained.

EXAMPLE 6

The nitride semiconductor substrate is grown similarly to Example 1, except for etching the protective film till the sapphire of the substrate is exposed while remaining a part of the protective film like column under the canopy part of the laterally-grown nitride semiconductor 4. The width of the protective film remained at both side of the leg part of the nitride semiconductor 4 is about 3.5 μm. The protective film is etched by anisotropy etching at 200° C. with CHF$_3$.

Figure 14A:
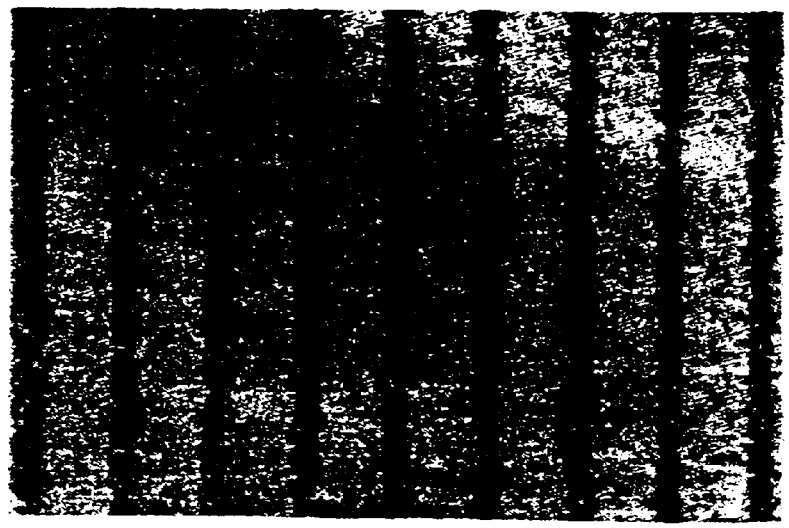
FIG. 14A and FIG. 14B are CL images of the nitride semiconductor substrate in Example 6 (FIG. 14A) and Comparable example 1 (FIG. 14B).
Figure 14A:

CL (cathode luminescence) observation of the surface of the second nitride semiconductor 5 is shown in FIG. 14A. While defects are observed over the windows of the protective film, few crystal defects are observed on the surface of the second nitride semiconductor 5 grown over the protective film except the joint portion. The number of the defects is about 6×10$^6$ cm$^{-2}$. At the joint portion, a few defects are observed, but the amount of the defects is much smaller than the prior art.

EXAMPLE 7

The nitride semiconductor substrate is grown similarly to Example 6, except for forming the protective film in hexagon arranged in honeycomb configuration as shown in FIG. 3A. The protective film is arranged so that the side of the hexagon is parallel to the orientation flat surface (A plane). The diameter A of the hexagon is about 20 μm, the interval B of the adjacent hexagon is about 5 μm.

No crystal defects are observed on the surface of the second nitride semiconductor 5 grown over the protective film except at the center of the hexagon.

EXAMPLE 8

The nitride semiconductor substrate is grown similarly to Example 6, except for the doping material for the first and second nitride semiconductor layer 4 and 5. The first nitride semiconductor layer 4 is grown without doping impurity material and the second nitride semiconductor layer is grown with SiH4 to dope Si as impurity material.

Satisfactory result substantially similar to Example 6 is obtained.

EXAMPLE 9

The nitride semiconductor substrate is grown similarly to Example 8, except for the doping material for the second nitride semiconductor layer 5. The second nitride semiconductor layer 5 is grown with CP$_2$Mg doping Mg as impurity material.

Satisfactory result substantially similar to Example 8 is obtained.

EXAMPLE 10

The nitride semiconductor substrate is grown similarly to Example 8, except for the doping material for the second nitride semiconductor layer 5 The second nitride semiconductor layer 5 is grown with SiH$_4$ and CP$_2$Mg to dope Si and Mg impurity material.

Satisfactory result substantially similar to Example 8 is obtained.

EXAMPLE 11

The nitride semiconductor substrate is grown similarly to Example 8, except for the doping material for the second nitride semiconductor layer 5. The second nitride semiconductor layer 5 is grown without doping impurity material.

Satisfactory result substantially similar to Example 8 is obtained.

COMPARATIVE EXAMPLE 1

A sapphire substrate 1 having principal plane in C plane and orientation slat surface in A plane is used. A buffer layer of GaN is formed to a thickness of 200 Å on the sapphire substrate 1 at a temperature of 510° C. by MOCVD process using hydrogen as the carrier gas and ammonia and TMG (trimethyl-gallium) as the stock material gas.

After growing the buffer layer, supply of only the TMG is stopped and the temperature is raised to 1050° C. When the temperature has reached 1050° C., nitride semiconductor 2 made of undoped GaN is grown to a thickness of 2.5 $\mu$m by using TMG, ammonia and silane gas as the stock material gas.

A protective film 3 made of $SiO_2$ is formed to a thickness of 0.5 $\mu$m by the CVD process on the nitride semiconductor 2 and, after forming a photo-mask of stripe configuration, the protective film 3 made of $SiO_2$ having stripe width of 14 $\mu$m and window size of 6 $\mu$m is formed by etching. Direction of the stripes of the protective film 3 is set perpendicular to the sapphire A plane.

Then the first nitride semiconductor 4 made of GaN is grown to a thickness of 15 $\mu$m at a temperature of 1050° C. under a reduced pressure by MOCVD process using TMG, ammonia, silane gas and $Cp_2Mg$ (cyclopentadienyl magnesium) as the stock material gas. In this process, the first nitride semiconductor 4 is grown from the window of the $SiO_2$ protective film and laterally grown on the protective film. The growth is continued until the first nitride semiconductor 4 completely covers the $SiO_2$ protective film.

Figure 14B:
Figure 14B:
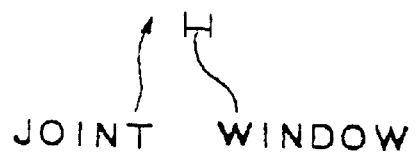

CL (cathode luminescence) observation of the surface of the second nitride semiconductor 4 is shown in FIG. 14B. Defects are observed not only over the windows of the protective film, but also at the joint of the nitride semiconductor 4.

While the present invention has been fully described in conjunction with the preferred embodiments by making reference to the accompanying drawings. It will be apparent for those skilled in the art that various modifications and alterations can be made. It should be understood that such modifications and alterations which do not deviate from the spirit and scope of the present invention are included in the present invention which is defined by the appended claims.

What is claimed is:

1. A method for manufacturing a nitride semiconductor substrate comprising:

forming a protective film including a plurality of windows of stripe, grid and/or island configuration on a supporting substrate;

laterally growing a first nitride semiconductor layer over said protective film from a plurality of exposed portions of said supporting substrate, the growth being stopped in such a state that films of said first nitride semiconductor layer growing laterally from respective starting points do not join together but oppose each other via respective clearances;

removing at least a part of said protective film; and growing a second nitride semiconductor layer laterally from the top surface or the top and side surface of said first nitride semiconductor layer to cover clearance(s) defined in said first nitride semiconductor layer so that cavities are formed below respective portions of the second nitride semiconductor layer which cover clearances defined in said first nitride semiconductor layer.

2. The method for manufacturing a nitride semiconductor substrate according to claim 1, wherein said supporting substrate is formed by growing a nitride semiconductor over the entire surface of a substrate made of different material.

3. The method for manufacturing a nitride semiconductor substrate according to claim 1, wherein said protective film is removed by etching or peeling off.

4. The method for manufacturing a nitride semiconductor substrate according to claim 1, wherein said protective film is removed until said supporting substrate is exposed.

5. The method for manufacturing a nitride semiconductor substrate according to claim 1, wherein said protective film is made of silicon oxide, silicon nitride, titanium oxide, or zirconium oxide or a multi-layered film of these materials, or a metal film which has a high melting point of 1200° C. or higher.

6. The method for manufacturing a nitride semiconductor substrate according to claim 1, further comprising removing said supporting substrate partially or totally.

7. The method for manufacturing a nitride semiconductor substrate according to claim 1, further comprising:

forming a middle layer made of nitride semiconductor having the thickness of not less than 10 $\mu$m on said second nitride semiconductor layer;

forming a second protective film having plurality of windows of stripe, grid and/or island configuration on said middle layer; and laterally growing a third nitride semiconductor over said second protective film from a plurality of exposed portions of said middle layer, the growth being stopped in such a state that films of said third nitride semiconductor layer growing laterally from respective starting points do not join together but oppose each other via respective clearances.

8. The method for manufacturing a nitride semiconductor substrate according to claim 7, further comprising removing said supporting substrate partially or totally.

* * * * *